(12) United States Patent
Baldovino et al.

(10) Patent No.: US 10,524,396 B2
(45) Date of Patent: Dec. 31, 2019

(54) SENSOR ASSEMBLY WITH COOLING

(71) Applicant: Ford Global Technologies, LLC, Dearborn, MI (US)

(72) Inventors: Segundo Baldovino, Novi, MI (US); Prashant Dubey, Canton, MI (US); Venkatesh Krishnan, Canton, MI (US); Ahmad Soufan, Lasalle (CA)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/983,160

(22) Filed: May 18, 2018

(65) Prior Publication Data
US 2019/0353793 A1 Nov. 21, 2019

(51) Int. Cl.
*H05K 7/20* (2006.01)
*F25B 21/02* (2006.01)
*G01S 17/93* (2006.01)
*G01S 7/481* (2006.01)

(52) U.S. Cl.
CPC ......... *H05K 7/20863* (2013.01); *F25B 21/02* (2013.01); *G01S 7/4813* (2013.01); *G01S 17/936* (2013.01); *H05K 7/20145* (2013.01); *H05K 7/20163* (2013.01); *H05K 7/20436* (2013.01)

(58) Field of Classification Search
CPC .......... H05K 7/20136–20145; H05K 7/20163; H05K 7/20863; G01S 17/936; G01S 7/4813; F25B 21/02; F25B 2321/0251; F25B 2250/08
USPC ........................ 361/679.46–679.54, 688–723
See application file for complete search history.

(56) References Cited

U.S. PATENT DOCUMENTS

| 6,538,888 | B1* | 3/2003 | Wei ....................... H01L 23/467 |
| | | | 165/121 |
| 9,386,205 | B2 | 7/2016 | Tsuzuki |
| 9,615,482 | B2* | 4/2017 | Salapakkam ......... H01L 23/467 |
| 9,885,526 | B2 | 2/2018 | Maranville et al. |
| 2016/0041452 | A1 | 2/2016 | Nomura et al. |
| 2017/0261273 | A1* | 9/2017 | Maranville ............... F25B 1/00 |
| 2018/0272997 | A1* | 9/2018 | Swain ................... G01S 7/4813 |

FOREIGN PATENT DOCUMENTS

| CN | 206161843 U | 5/2017 |
| DE | 102016015317 A1 | 7/2017 |
| EP | 2605043 B1 | 7/2014 |

* cited by examiner

*Primary Examiner* — Zachary Pape
(74) *Attorney, Agent, or Firm* — Frank A. MacKenzie; Bejin Bieneman PLC

(57) ABSTRACT

A sensor assembly includes an elongated tubular beam, a chamber positioned to receive air from the beam, and a sensor thermally connected to the chamber. The chamber has a plurality of outlet holes. A plurality of fins may be disposed in the beam and/or the chamber. The sensor may be supported by the beam.

21 Claims, 4 Drawing Sheets

SENSOR ASSEMBLY WITH COOLING

BACKGROUND

Autonomous vehicles typically include a variety of sensors. One such type of sensor is a light detection and ranging (LIDAR) device. A LIDAR device detects distances to objects by emitting laser pulses and measuring the time of flight for the pulse to travel to the object and back. A typical current model of LIDAR device generates 50 watts of heat and is sometimes exposed to prolonged direct sunlight. The typical current model of LIDAR device experiences performance degradation at above about 65° C.

DETAILED DESCRIPTION

Figure 1:
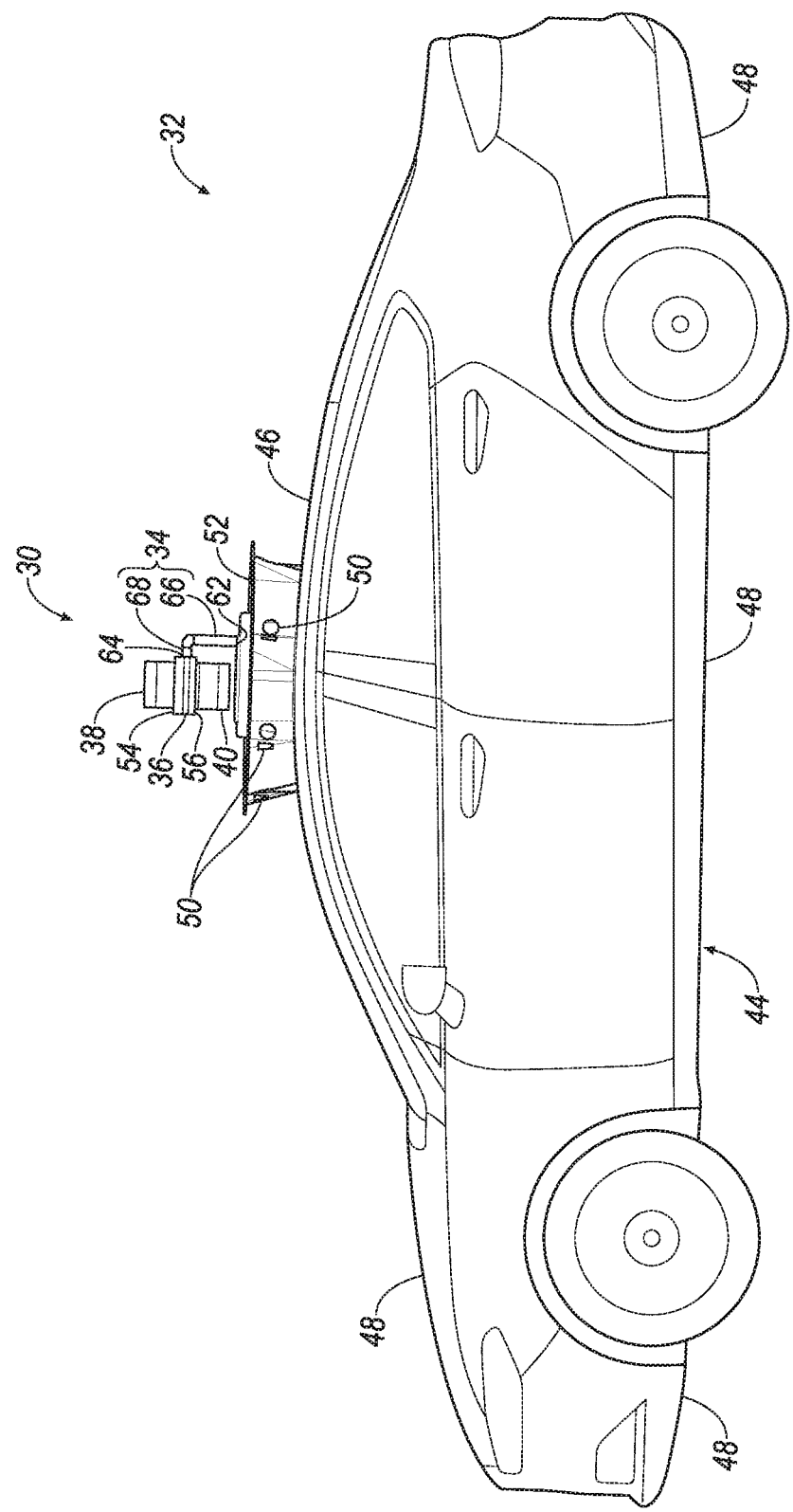
FIG. 1 is a side view of an example vehicle.

A sensor assembly includes an elongated tubular beam, a chamber positioned to receive air from the beam, and a sensor thermally connected to the chamber. The chamber has a plurality of outlet holes.

The sensor assembly may further include a plurality of fins disposed in the beam. The fins may have an airfoil shape. The beam and the fins may be integral. The fins may be oblique to a direction of airflow defined by the beam.

The sensor assembly may further include a plurality of fins disposed in the chamber. The fins may have an airfoil shape. The chamber and the fins may be integral. The fins may be each arranged to deflect airflow from the beam toward a nearest of the outlet holes. The chamber may be toroidal and define a circumferential direction, and the fins may be oblique to the circumferential direction.

The sensor may be supported by the beam. The beam may be positioned to support the entire weight of the sensor.

The sensor assembly may further include a thermoelectric cooler positioned to draw heat from the sensor and expel heat to the chamber. The chamber may be toroidal and define a central cavity, and the thermoelectric cooler may be positioned in the central cavity. The sensor assembly may further include a plate contacting the sensor, the chamber, and the thermoelectric cooler, and the plate may be thermally conductive.

The chamber may be toroidal, the sensor may be cylindrical, and the chamber may have an outer diameter at least as great as a diameter of the sensor.

The sensor assembly may further include a plate contacting the sensor and the chamber, and the plate may be thermally conductive.

The sensor may be a first sensor, the sensor assembly may further include a second sensor, and the chamber may be thermally connected to the second sensor and disposed between the first and second sensor.

The sensor assembly may further include a blower positioned to move air through the beam. The blower may be disposed in the beam.

A sensor assembly 30 for a vehicle 32 includes an elongated tubular beam 34, a chamber 36 positioned to receive air from the beam 34, and at least one first or second sensor 38, 40 thermally connected to the chamber 36. The chamber 36 has a plurality of outlet holes 42.

The sensor assembly 30 provides an efficient and effective way to expel heat generated by the first and second sensors 38, 40 or absorbed by the first and second sensors 38, 40 from the environment. The sensor assembly 30 can provide a significant temperature reduction compared to a sensor operating in the same environment without the beam 34 and the chamber 36. The first and second sensors 38, 40 can experience improved performance and can maintain acceptable performance in a wider range of environmental situations.

With reference to FIG. 1, the vehicle 32 may be an autonomous vehicle. A computer can be programmed to operate the vehicle 32 independently of the intervention of a human driver, completely or to a lesser degree. The computer may be programmed to operate the propulsion, brake system, steering, and/or other vehicle systems. For the purposes of this disclosure, autonomous operation means the computer controls the propulsion, brake system, and steering without input from a human driver; semi-autonomous operation means the computer controls one or two of the propulsion, brake system, and steering and a human driver controls the remainder; and nonautonomous operation means a human driver controls the propulsion, brake system, and steering.

The vehicle 32 includes a body 44. The vehicle 32 may be of a unibody construction, in which a frame and a body 44 of the vehicle 32 are a single component. The vehicle 32 may, alternatively, be of a body-on-frame construction, in which the frame supports a body 44 that is a separate component from the frame. The frame and body 44 may be formed of any suitable material, for example, steel, aluminum, etc. The body 44 includes body panels 46, 48 partially defining an exterior of the vehicle 32. The body panels 46, 48 may present a class-A surface, e.g., a finished surface exposed to view by a customer and free of unaesthetic blemishes and defects. The body panels 46, 48 include, e.g., a roof 46, etc.

The sensor assembly 30 includes a plurality of sensors, e.g., the first sensor 38, the second sensor 40, and third sensors 50. The third sensors 50 may be housed in a casing 52 on the roof 46, and the first and second sensors 38, 40 may be exposed outside the casing 52, e.g., above the casing 52 and the roof 46. The sensor assembly 30 may include any suitable number of sensors.

The sensors 38, 40, 50 may provide data about operation of the vehicle 32, for example, wheel speed, wheel orientation, and engine and transmission data (e.g., temperature, fuel consumption, etc.). The sensors 38, 40, 50 may detect the location and/or orientation of the vehicle 32. For example, the sensors 38, 40, 50 may include global positioning system (GPS) sensors; accelerometers such as piezoelectric or microelectromechanical systems (MEMS); gyroscopes such as rate, ring laser, or fiber-optic gyroscopes; inertial measurements units (IMU); and magnetometers. The sensors 38, 40, 50 may detect the external world, e.g., objects and/or characteristics of surroundings of the vehicle 32, such as other vehicles, road lane markings, traffic lights and/or signs, pedestrians, etc. For example, the sensors 38, 40, 50 may include radar sensors, scanning laser range finders, light detection and ranging (LIDAR) devices, and image processing sensors such as cameras. The sensors 38, 40, 50 may include communications devices, for example, vehicle-to-infrastructure (V2I) or vehicle-to-vehicle (V2V) devices.

Figure 2:
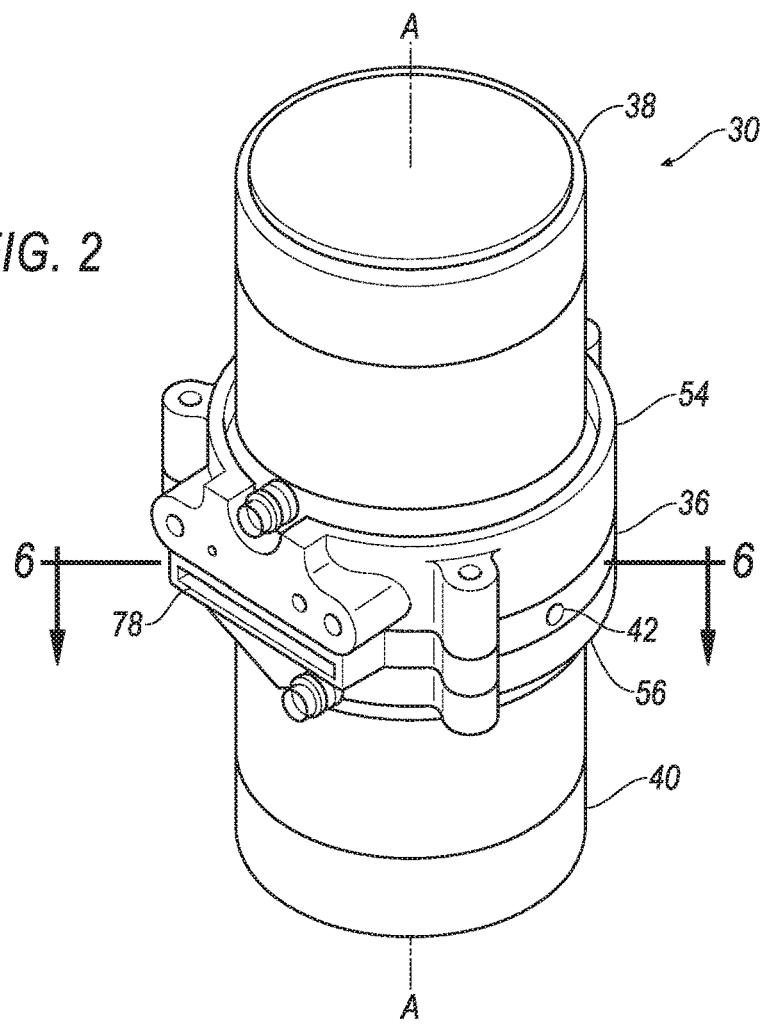
FIG. 2 is a rear perspective view of part of an example sensor assembly of the vehicle of FIG. 1.

With reference to FIG. 2, the first and second sensors 38, 40 may be LIDAR devices. A LIDAR device detects distances to objects by emitting laser pulses at a particular wavelength and measuring the time of flight for the pulse to travel to the object and back. The first and second sensors 38, 40 may each have a cylindrical shape oriented vertically, i.e., an axis A of the cylindrical shape is substantially vertical. The first and second sensors 38, 40 may define the axis A. The first and second sensors 38, 40 may have a 360° horizontal field of view.

Figure 3:
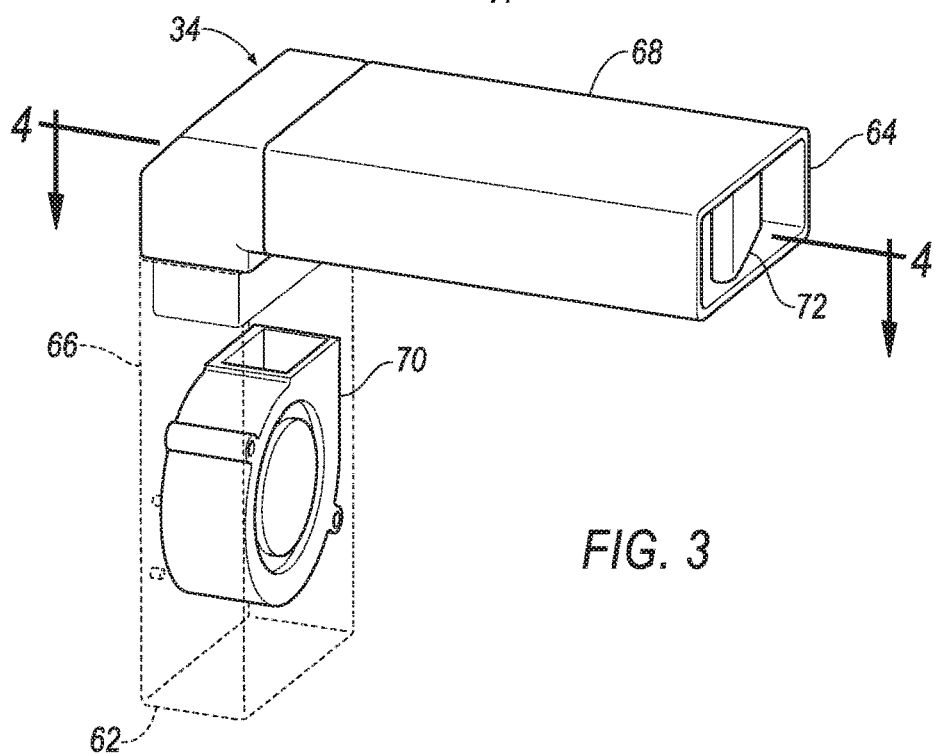
FIG. 3 is a perspective view of a beam of an example sensor assembly of FIG. 2.

With reference to FIG. 3, the sensor assembly 30 may include the beam 34, which is connectable to the vehicle 32. For example, the beam 34 may be attached to the casing 52 that supports and/or houses the third sensors 50, as shown in FIG. 1. The beam 34 may be elongated vertically relative to the vehicle 32. The beam 34 may be a rigid structure that is positioned to support at least some weight of the components of the sensor assembly 30, e.g., the first and/or second sensors 38, 40, at a height from the rest of the vehicle 32. For example, the beam 34 may support the entire weight of the first and second sensors 38, 40, the chamber 36, first and second plates 54, 56, and/or first and second thermoelectric coolers 58, 60. The beam 34 may be integral with the casing 52, or the beam 34 may be a separate piece that is fixedly attached to the casing 52, e.g., via conventional attachment means, such as adhesives, fasteners, snaps, etc.

The beam 34 has an elongated tubular shape. The tubular shape may have any suitable cross-sectional shape, e.g., rectangular, circular, oval, etc. With continued reference to FIG. 3, the beam 34 is elongated vertically and/or horizontally from a first end 62 to a second end 64. The beam 34 may include a first section 66 elongated vertically from the first end 62 and a second section 68 elongated horizontally to the second end 64. The first section 66 may be attached to the casing 52 at the first end 62, and the second section 68 may be attached to the chamber 36 at the second end 64. The first end 62 may receive air from inside the casing 52 or alternatively may be open to the atmosphere. The beam 34 defines a path along which air is free to travel from the first end 62 to the second end 64.

A blower 70 may be positioned to move air through the beam 34. For example, the blower 70 may be disposed in the beam 34, e.g., in the first section 66. The blower 70 may be positioned to receive air from the first end 62 of the beam 34 and to push air toward the second end 64 of the beam 34. The blower 70 may be any suitable type of blower for moving air through the beam 34, e.g., a centrifugal blower, a positive-displacement blower, a fan, etc. A direction toward the first end 62 of the beam 34 is referred to as "upstream," i.e., against the direction of air travel when the blower 70 is activated, and a direction toward the second end 64 of the beam 34 is referred to as "downstream," i.e., in the direction of air travel when the blower 70 is activated.

Figure 4:
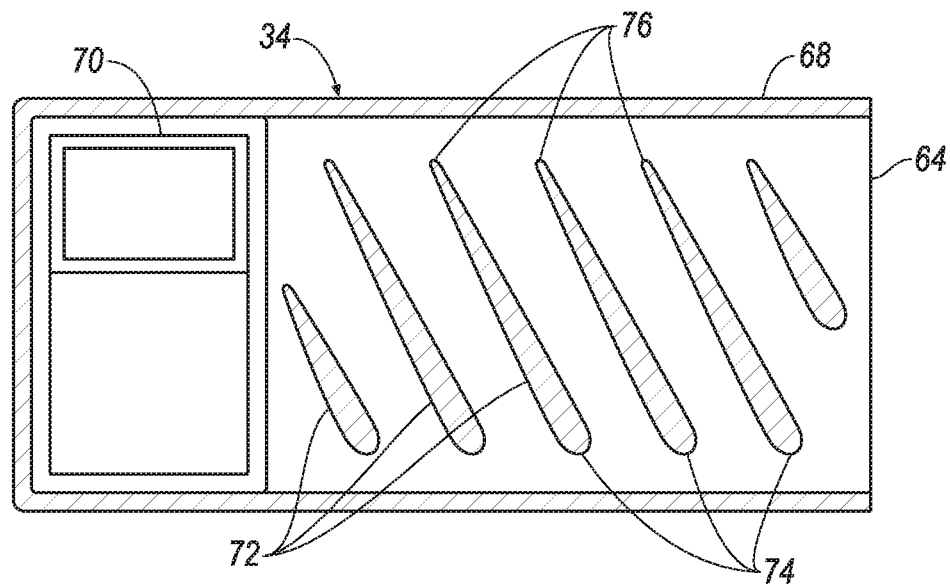
FIG. 4 is a cross-sectional view of the beam of FIG. 3.

With reference to FIG. 4, a plurality of first fins 72 may be disposed in the beam 34. The first fins 72 may extend across an inside of the beam 34, i.e., from one side of a cross-section of the beam 34 to the other side of the cross-section of the beam 34. The first fins 72 may have an airfoil shape with a thicker end 74 and a thinner end 76. The thinner end 76 may be disposed upstream relative to the beam 34, and the thicker end 74 may be disposed downstream relative to the beam 34. The first fins 72 may be oblique to a direction of airflow defined by the beam 34. The beam 34 and the first fins 72 may be integral, i.e., made of a single piece of material with no seams, joints, fasteners, or adhesives holding the beam 34 and the first fins 72 together.

Figure 5:
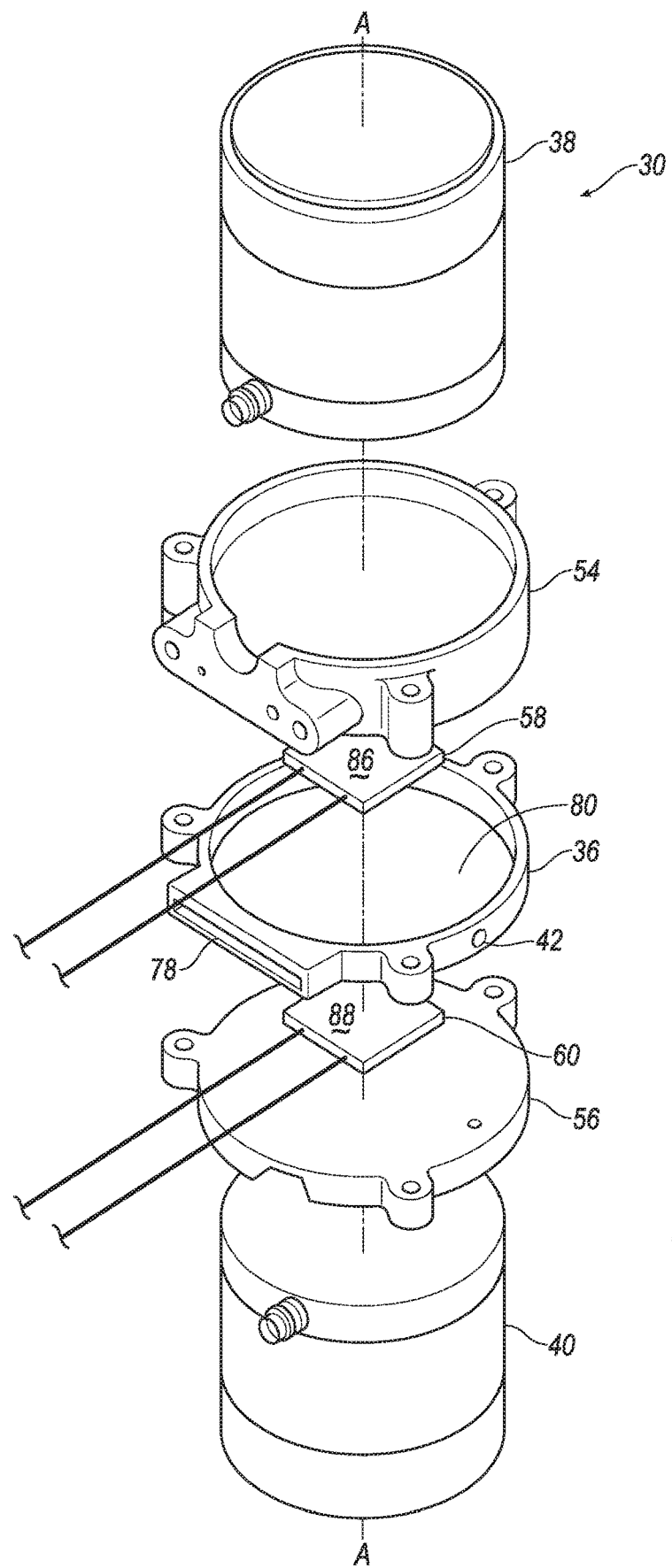
FIG. 5 is an exploded view of the part of the sensor assembly of FIG. 2.

With reference to FIG. 5, the chamber 36 may be disposed between the first and second sensors 38, 40 and positioned to receive air from the beam 34. The chamber 36 has an inlet opening 78 connectable to the second end 64 of the beam 34. The chamber 36 is thermally connected to the first sensor 38 and/or to the second sensor 40, such that heat generated by the first and second sensors 38, 40 flows to the chamber 36 and then to the external environment. For the purposes of this disclosure, "thermally connected" is defined as attached such that heat flows such that both ends of the thermal connection (if separate) are substantially the same temperature within a short time period after operation of the blower 70. The thermal connection may be convective and/or conductive. Examples include heat transfer by air flow and/or heat sinks. As one example, as described in more detail below, the first and second sensors 38, 40 may contact plates 54, 56, i.e., heat sinks, contacting the chamber 36, and the plates 54, 56 may have a high thermal conductivity.

The chamber 36 may be toroidal. The chamber 36 may have an outer diameter at least as great as a diameter of the first and second sensors 38, 40. The chamber 36 may define the axis A that is orthogonal to the plane of the toroidal shape and passes through a center of the toroidal shape, and the chamber 36 may define a circumferential direction along the toroidal shape. The chamber 36 may define a central cavity 80 and an inner cavity 82. The central cavity 80 may be in a middle of the toroidal shape. The inner cavity 82 may follow the toroidal shape, and the chamber 36 may enclose the inner cavity 82 except for the inlet opening 78 and the outlet holes 42.

Figure 6:
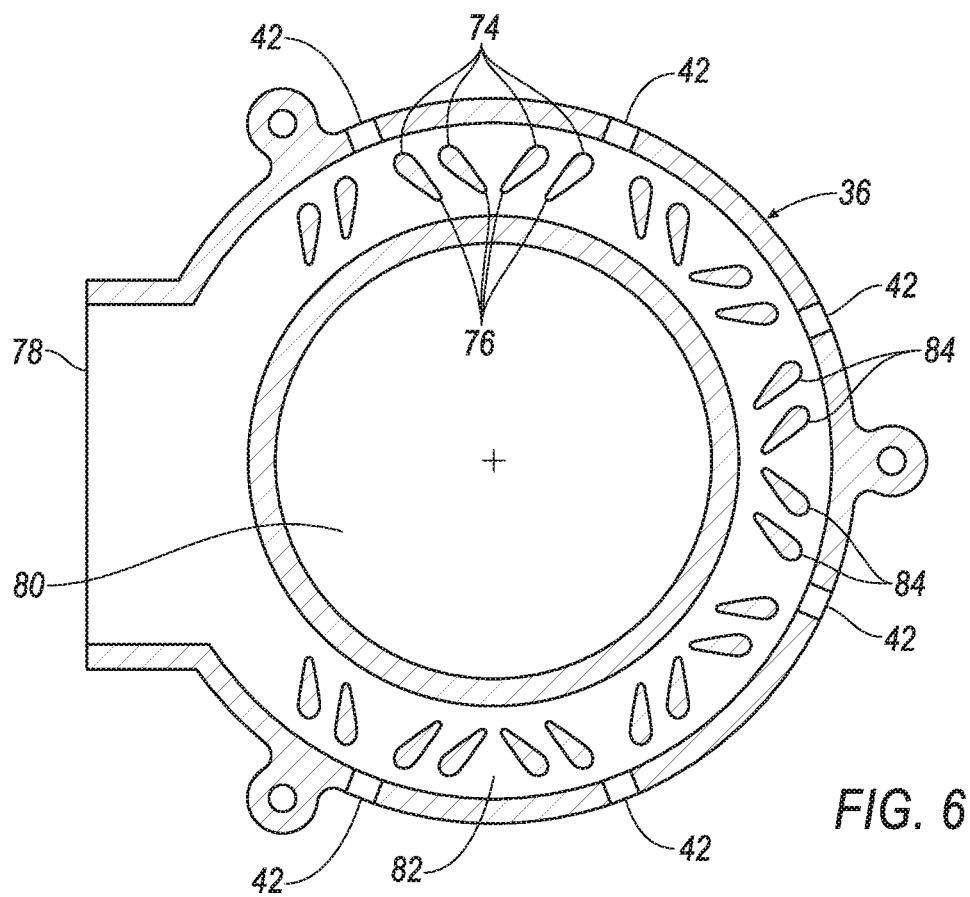
FIG. 6 is a cross-sectional view of a chamber of the sensor assembly of FIG. 2.

With reference to FIG. 6, the chamber 36 includes the outlet holes 42. The outlet holes 42 lead from the inner cavity 82 to exterior to the chamber 36. The outlet holes 42 may be radially directed away from the axis A. The outlet holes 42 permit air that enters the inner cavity 82 from the beam 34 to exit the inner cavity 82.

A plurality of second fins 84 may be disposed in the chamber 36. The second fins 84 may extend across the inner cavity 82; for example, the second fins 84 may be oriented vertically and extend from a top of the inner cavity 82 to a bottom of the inner cavity 82. The second fins 84 may be arranged to deflect airflow from the beam 34 toward a nearest of the outlet holes 42. The second fins 84 may be oblique to the circumferential direction defined by the chamber 36. The second fins 84 may each extend in a direction toward the nearest of the outlet holes 42. The second fins 84 may have an airfoil shape with the thicker end 74 and the thinner end 76. The thicker end 74 may be disposed closer to the nearest of the outlet holes 42 to the respective second fin than the thinner end 76. The chamber 36 and the second fins 84 may be integral, i.e., made of a single piece of material with no seams, joints, fasteners, or adhesives holding the chamber 36 and the second fins 84 together.

Returning to FIG. 5, the plates 54, 56 include the first plate 54 and the second plate 56. The first plate 54 may contact the first sensor 38, the chamber 36, and the first thermoelectric cooler 58. The second plate 56 may contact the second sensor 40, the chamber 36, and the second thermoelectric cooler 60. The plates 54, 56 may be disc-shaped with a diameter approximately equal to the diameter of the first and second sensors 38, 40. The plates 54, 56 and the chamber 36 may enclose a central cavity 80, as described below. The plates 54, 56 are thermally conductive, i.e., have a high thermal conductivity, e.g., a thermal conductivity equal to at least 15 watts per meter-Kelvin (W/(m K)), e.g., greater than 100 W/(m K), at 25° C. For example, the plates 54, 56 may be aluminum.

The thermoelectric coolers 58, 60 operate according to the Peltier effect to generate a heat flux from a cool side 86 to a hot side 88. The thermoelectric coolers 58, 60 may be positioned to draw heat from the first and second sensors 38, 40 and to expel heat to the chamber 36. For example, the thermoelectric coolers 58, 60 may contact the plates 54, 56 and be positioned in the central cavity 80. The first thermoelectric cooler 58 may contact the first plate 54; e.g., the cool side 86 of the first thermoelectric cooler 58 may contact the first plate 54, and the hot side 88 of the first thermoelectric cooler 58 may face the central cavity 80. The second thermoelectric cooler 60 may contact the second plate 56; e.g., the cool side 86 of the second thermoelectric cooler 60 may contact the second plate 56, and the hot side 88 of the second thermoelectric cooler 60 may face the central cavity 80.

In the normal course of operation, the first and second sensors 38, 40 generate heat, and some of that heat is expelled to the environment via the components of the sensor assembly 30. The path for a significant quantity of the heat is from the first or second sensor 38, 40 to the first or second plate 54, 56 and then to the chamber 36. The heat may flow from the plates 54, 56 to the chamber 36 via direct contact or via the central cavity 80. The thermoelectric coolers 58, 60 may increase the rate of heat flowing from the plates 54, 56 through the central cavity 80 to the chamber 36. The blower 70 generates airflow through the inner cavity 82 of the chamber 36 and out the outlet holes 42. Heat flowing to the chamber 36 is transferred to the airflow and exits the sensor assembly 30 along with the air. The sensor assembly 30 thus efficiently expels heat generated by the first and second sensors 38, 40.

The disclosure has been described in an illustrative manner, and it is to be understood that the terminology which has been used is intended to be in the nature of words of description rather than of limitation. The adjectives "first," "second," and "third" are used throughout this document as identifiers and are not intended to signify importance or order. Many modifications and variations of the present disclosure are possible in light of the above teachings, and the disclosure may be practiced otherwise than as specifically described.

What is claimed is:

1. A sensor assembly comprising:
an elongated tubular beam;
a chamber positioned to receive air from the beam, the chamber having a plurality of outlet holes;
a sensor thermally connected to the chamber; and
a plurality of fins disposed in the chamber;
wherein the chamber is toroidal and defines a circumferential direction; and
the fins are oblique to the circumferential direction.

2. The sensor assembly of claim 1, wherein the fins are second fins, the sensor assembly further comprising a plurality of first fins disposed in the beam.

3. The sensor assembly of claim 2, wherein the first fins have an airfoil shape.

4. The sensor assembly of claim 2, wherein the beam and the first fins are integral.

5. The sensor assembly of claim 2, wherein the first fins are oblique to a direction of airflow defined by the beam.

6. The sensor assembly of claim 1, wherein the fins have an airfoil shape.

7. The sensor assembly of claim 1, wherein the chamber and the fins are integral.

8. The sensor assembly of claim 1, wherein the fins are each arranged to deflect airflow from the beam toward a nearest of the outlet holes.

9. The sensor assembly of claim 1, wherein the sensor is supported by the beam.

10. The sensor assembly of claim 9, wherein the beam is positioned to support the entire weight of the sensor.

11. The sensor assembly of claim 1, further comprising a thermoelectric cooler positioned to draw heat from the sensor and expel heat to the chamber.

12. The sensor assembly of claim 11, wherein the chamber defines a central cavity, and the thermoelectric cooler is positioned in the central cavity.

13. The sensor assembly of claim 12, further comprising a plate contacting the sensor, the chamber, and the thermoelectric cooler, wherein the plate is thermally conductive.

14. The sensor assembly of claim 1, wherein the sensor is cylindrical, and the chamber has an outer diameter at least as great as a diameter of the sensor.

15. The sensor assembly of claim 1, further comprising a plate contacting the sensor and the chamber, wherein the plate is thermally conductive.

16. The sensor assembly of claim 1, wherein the sensor is a first sensor, the sensor assembly further comprising a second sensor, wherein the chamber is thermally connected to the second sensor and disposed between the first and second sensor.

17. The sensor assembly of claim 1, further comprising a blower positioned to move air through the beam.

18. The sensor assembly of claim 17, wherein the blower is disposed in the beam.

19. A sensor assembly comprising:
an elongated tubular beam;
a chamber positioned to receive air from the beam, the chamber having a plurality of outlet holes;
a sensor thermally connected to the chamber; and
a plurality of fins disposed in the beam;
wherein the fins are oblique to a direction of airflow defined by the beam.

20. A sensor assembly comprising:
an elongated tubular beam;
a chamber positioned to receive air from the beam, the chamber having a plurality of outlet holes;
a sensor thermally connected to the chamber; and
a thermoelectric cooler positioned to draw heat from the sensor and expel heat to the chamber;
wherein the chamber is toroidal and defines a central cavity; and
the thermoelectric cooler is positioned in the central cavity.

21. A sensor assembly comprising:
an elongated tubular beam;
a chamber positioned to receive air from the beam, the chamber having a plurality of outlet holes;
a first sensor thermally connected to the chamber; and
a second sensor thermally connected to the chamber;
wherein the chamber is disposed between the first and second sensor.

* * * * *